United States Patent
Chang et al.

(10) Patent No.: US 8,759,928 B2
(45) Date of Patent: Jun. 24, 2014

(54) IMAGE SENSOR CROSS-TALK REDUCTION SYSTEM AND METHOD

(75) Inventors: Shih-Chieh Chang, Taipei (TW); Jian-Shin Tsai, Tainan (TW); Chih-Chang Huang, Chiayi (TW); Ing-Ju Lee, Tainan (TW); Chi-Cheng Hung, Tainan (TW); Jun-Nan Nian, Tainan (TW); Chih-Chung Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 49 days.

(21) Appl. No.: 13/439,628

(22) Filed: Apr. 4, 2012

(65) Prior Publication Data

US 2013/0264668 A1 Oct. 10, 2013

(51) Int. Cl.
*H01L 31/02* (2006.01)
*H01L 27/14* (2006.01)

(52) U.S. Cl.
USPC ............. 257/431; 257/E31.113; 438/96

(58) Field of Classification Search
USPC ......... 257/431–436, 461–464, 222, 225, 228, 257/232–234, 440, E27.13–E27.16; 438/24, 48, 66, 73–75
See application file for complete search history.

(56) References Cited

U.S. PATENT DOCUMENTS

| | | | |
|---|---|---|---|
| 7,564,079 B2 | 7/2009 | Mabuchi et al. | |
| 7,589,777 B2 | 9/2009 | Takayama et al. | |
| 2008/0173904 A1* | 7/2008 | Liu et al. | 257/233 |
| 2008/0198454 A1* | 8/2008 | Wang et al. | 359/486 |
| 2009/0096049 A1 | 4/2009 | Oshiyama et al. | |
| 2009/0246373 A1* | 10/2009 | Tachibana et al. | 427/255.23 |
| 2010/0038523 A1* | 2/2010 | Venezia et al. | 250/216 |
| 2010/0110271 A1 | 5/2010 | Yanagita et al. | |
| 2011/0049589 A1* | 3/2011 | Chuang et al. | 257/292 |
| 2012/0007156 A1* | 1/2012 | Chuang et al. | 257/292 |

FOREIGN PATENT DOCUMENTS

JP 4534634 9/2010

* cited by examiner

*Primary Examiner* — Fernando L Toledo
*Assistant Examiner* — Lawrence-Linh T Nguyen
(74) *Attorney, Agent, or Firm* — Slater and Matsil, L.L.P.

(57) ABSTRACT

A system and method for reducing cross-talk in complementary metal oxide semiconductor back side illuminated image sensors is provided. An embodiment comprises forming a grid around the pixel regions on an opposite side of the substrate than metallization layers. The grid may be formed of a material such as tungsten with a (110)-rich crystalline orientation. This orientation helps prevents defects that can occur during patterning of the grid.

20 Claims, 7 Drawing Sheets

IMAGE SENSOR CROSS-TALK REDUCTION SYSTEM AND METHOD

BACKGROUND

Complementary metal oxide semiconductor image sensors generally utilize a series of photodiodes formed within an array of pixel regions of a semiconductor substrate in order to sense when light has impacted the photodiode. Adjacent to each of the photodiodes within each of the pixel regions a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensors may generally be formed in either a front side illumination configuration or a back-side illumination configuration. In a front-side illumination configuration light passes to the photodiode from the "front" side of the image sensor where the transfer transistor has been formed. However, forcing the light to pass through any overlying metal layers, dielectric layers, and past the transfer transistor before it reaches the photodiode may generate processing and/or operational issues as the metal layers, dielectric layers, and the transfer transistor may not necessarily be translucent and easily allow the light to pass through.

In a back-side illumination configuration, the transfer transistor, the metal layers, and the dielectric layers are formed on a the front side of the substrate, and light is allowed to pass to the photodiode from the "back" side of the substrate such that the light hits the photodiode before it reaches the transfer transistor, the dielectric layers, or the metal layers. Such a configuration may reduce the complexity of the manufacturing of the image sensor and its operation.

However, pixel regions that are adjacent to each other may interfere with each other's operation in what is known as cross-talk. This cross-talk may occur when light from one pixel region makes its way into an adjacent pixel region, thereby causing the adjacent pixel region to sense the light. Such cross-talk can reduce the precision and efficiency of the image sensor.

BRIEF DESCRIPTION OF THE DRAWINGS

For a more complete understanding of the embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

Embodiments will be described with respect to a specific context, namely a complementary metal oxide semiconductor (CMOS) back side illuminated image sensor. Other embodiments may also be applied, however, to other back image sensors and other semiconductor devices.

Figure 1:
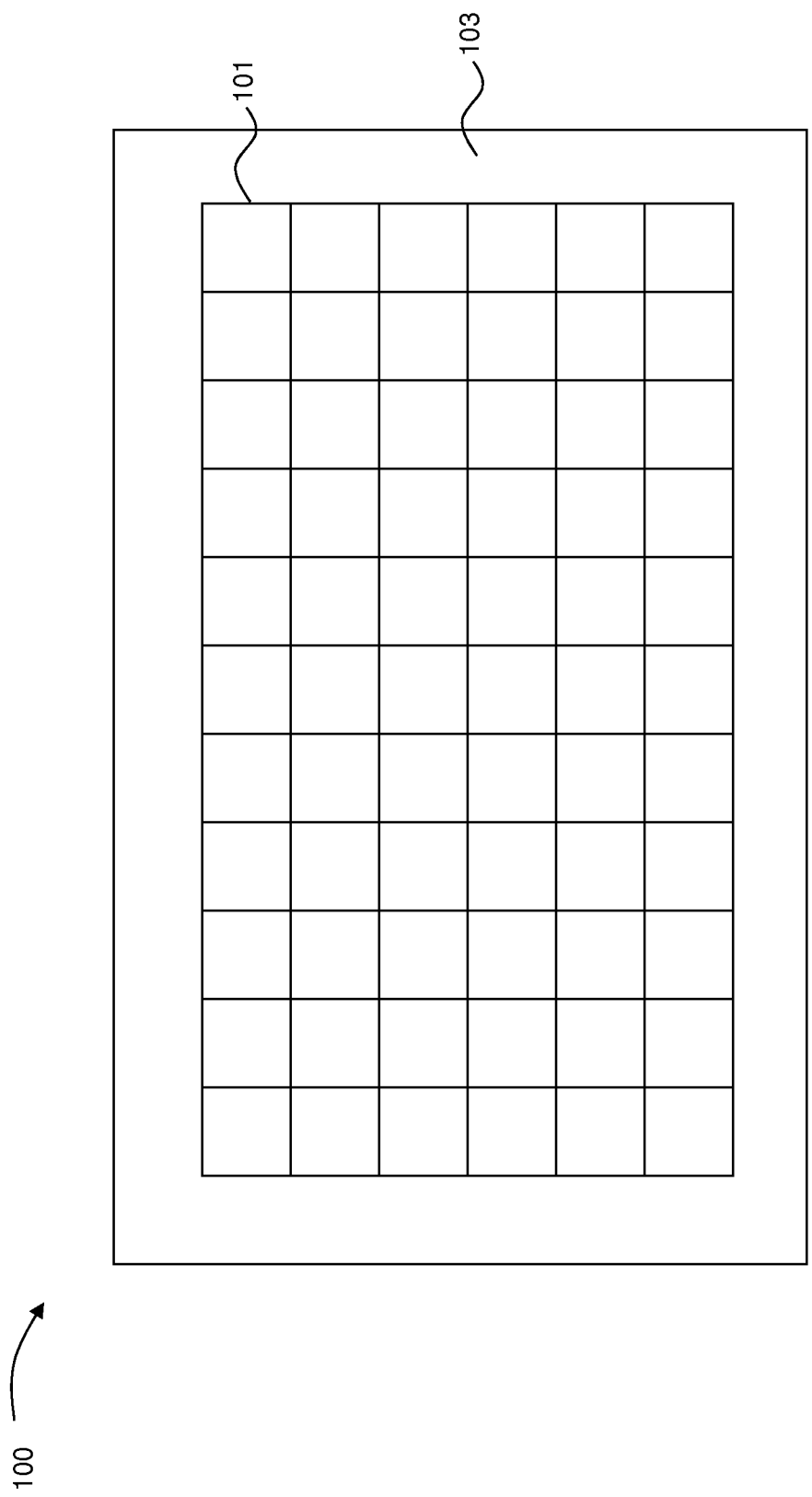
FIG. 1 illustrates an image sensor in accordance with an embodiment.

With reference now to FIG. 1, there is shown an image sensor 100 which comprises a grid or array of backside illuminated pixel regions 101. The image sensor 100 also may comprise a logic region 103 located adjacent to the array of pixel regions 101. The logic region 103 may have additional circuitry and contacts for input and output connections to and from the array of pixel regions 101. The logic region 103 is utilized to provide an operating environment for the pixel regions 101 and to moderate communications between the array of pixel regions 101 and outside devices (not shown).

Figure 2:
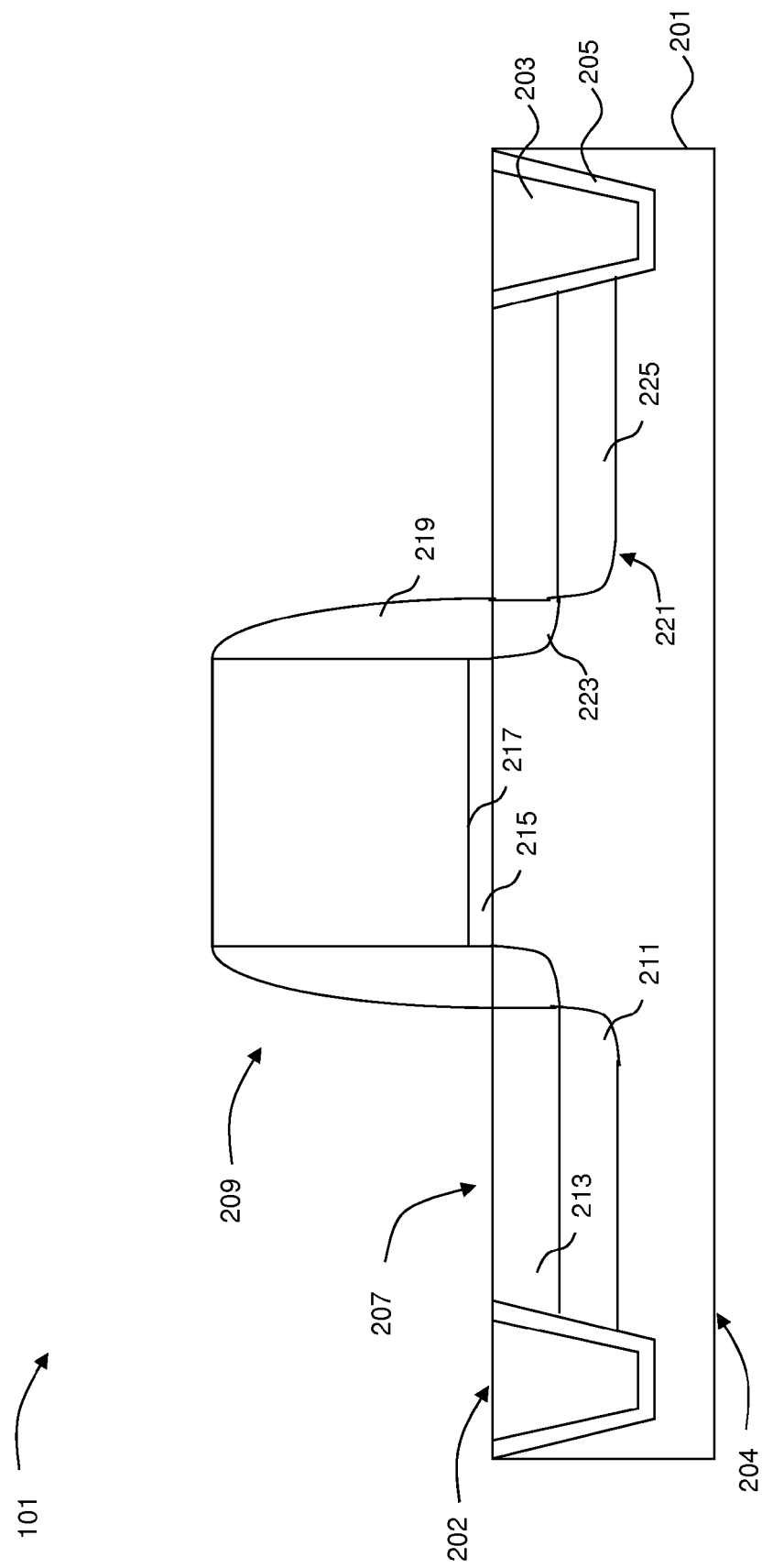
FIG. 2 illustrates a cross-section of a pixel region in accordance with an embodiment.

FIG. 2 illustrates a simplified cross-sectional view of an individual pixel region 101 (see FIG. 1). The pixel region 101 may be formed on a substrate 201, which may comprise a front side 202 and a back side 204 and may be a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 201 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 201 may be doped with a p-type dopant, such as boron, aluminum, gallium, or the like, although the substrate may alternatively be doped with an n-type dopant, as is known in the art.

The substrate 201 additionally comprises a plurality of isolation structures 203 designed to separate and isolate various devices formed on the substrate 201 (e.g., the individual pixel regions 101), and also to separate the pixel regions 101 from the logic region 103. The isolation structures 203 may be shallow trench isolations generally formed by etching the substrate 201 to form a trench and filling the trench with dielectric material as is known in the art. The isolation structures 203 may be filled with a dielectric material such as an oxide material, a high-density plasma (HDP) oxide, or the like, formed by conventional methods known in the art. Optionally, an oxide liner 205 may be formed along the sidewalls of the isolation structures 203.

The pixel region 101 may comprise a photosensitive diode 207 adjacent to a first transistor 209, which may generate a signal related to the intensity or brightness of light that impinges on the photosensitive diode 207. In an embodiment the photosensitive diode 207 may be a pinned layer photodiode, which may comprise an n-type doped region 211 formed in the substrate 201 (which in this embodiment may be a p-type substrate) and also may comprise a heavily doped p-type region 213 (referred to as the pinned layer) formed on the surface of the n-type doped region 211 to form a p-n-p junction. The p-type doped region 213 and heavily doped n-type region 211 may be formed using suitable implantation processes to implant p-type dopants (e.g., boron, gallium, indium, or the like) and n-type dopants (e.g., phosphorous, arsenic, antimony, or the like), as is known in the art.

Further, as one of ordinary skill in the art will recognize, the pinned layer photodiode described above is merely one type of photosensitive diode 207 that may be used in the embodiments. For example, a non-pinned layer photodiode may alternatively be used. Any suitable photodiode may be utilized with the embodiments, and all of these photodiodes are intended to be included within the scope of the embodiments.

Figure 3:
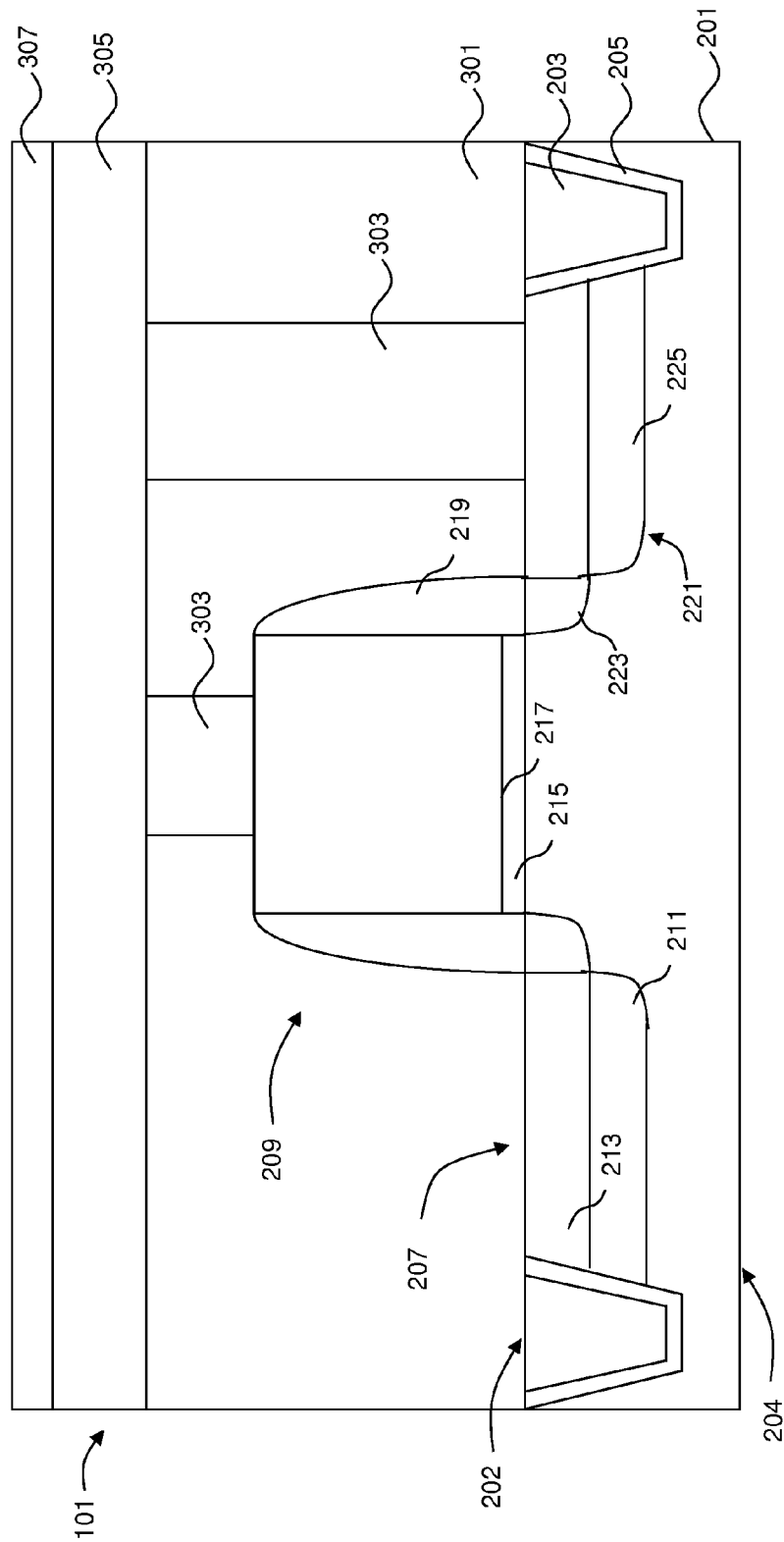
FIG. 3 illustrates a formation of a metallization layer over the pixel region in accordance with an embodiment.

The first transistor 209 may be a transfer transistor. However, the first transistor 209 is also merely representative of the many types of functional transistors that may be utilized within the pixel region 101. For example, while the first transistor 209 is illustrated in FIG. 3 as a transfer transistor, embodiments may additionally include other transistors located within the pixel region 101, such as a reset transistor, source follower transistor, or a select transistor. These transistors may be arranged, for example, to form a four transistor CMOS image sensor (CIS). All suitable transistors and configurations that may be utilized in an image sensor are fully intended to be included within the scope of the embodiments.

The first transistor 209 may comprise a gate dielectric 215 adjacent the substrate 201, a gate electrode 217 over the gate dielectric, and spacers 219 along the sidewalls of the gate dielectric 215 and gate electrode 217. Gate dielectric 215 and gate electrode 217 may be formed and patterned on the substrate 201 by any suitable process known in the art. The gate dielectric 215 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectric 215 may have a relative permittivity value greater than about 4.

In an embodiment in which the gate dielectric 215 comprises an oxide layer, the gate dielectric 215 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectric 215 is between about 10 Å to about 150 Å in thickness, such as 100 Å in thickness.

The gate electrode 217 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 217 is poly-silicon, the gate electrode 217 may be formed by depositing doped or undoped poly-silicon by low-pressure chemical vapor deposition (LPCVD) to a thickness in the range of about 100 Å to about 2,500 Å, such as 1,200 Å.

Spacers 219 are formed on the sidewalls of the gate dielectric 215 and the gate electrode 217. The spacers 219 are typically formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 219, such as by anisotropically etching to remove the spacer layer from the horizontal surfaces of the structure.

A source/drain region 221 may be formed in the substrate 201 on an opposing side of the gate dielectric 215 from the photosensitive diode 207. In an embodiment in which the substrate 201 is a p-type substrate, the source/drain region 221 may be formed by implanting appropriate n-type dopants such as phosphorous, arsenic, antimony, or the like. The source/drain region 221 may be implanted using the gate electrode 217 and the spacers 219 as masks to form lightly doped source/drain (LDD) regions 223 and heavily doped source/drain regions 225.

It should be noted that one of ordinary skill in the art will realize that many other processes, steps, or the like may be used to form the source/drain region 221 and the photosensitive diode 207. For example, one of ordinary skill in the art will realize that a plurality of implants may be performed using various combinations of spacers and liners to form the source/drain region 221 and the photosensitive diode 207 having a specific shape or characteristic suitable for a particular purpose. Any of these processes may be used to form the source/drain region 221 and the photosensitive diode 207, and the above description is not meant to limit the embodiments to the steps presented above.

FIG. 3 illustrates the formation of a first inter-layer dielectric (ILD) layer 301 over the pixel region 101 and the formation of contacts 303 through the first ILD layer 301. The first ILD layer 301 may comprise a material such as boron phosphorous silicate glass (BPSG), although any suitable dielectrics may be used for either layer. The first ILD layer 301 may be formed using a process such as PECVD, although other processes, such as LPCVD, may alternatively be used. The first ILD layer 301 may be formed to a thickness of between about 100 Å and about 3,000 Å.

The contacts 303 may be formed through the first ILD layer 301 with suitable photolithography and etching techniques. Generally, these photolithography techniques involve depositing a photoresist material, which is masked, exposed, and developed to expose portions of the first ILD layer 301 that are to be removed. The remaining photoresist material protects the underlying material from subsequent processing steps, such as etching. In an embodiment photoresist material is utilized to create a patterned mask to define contacts 303. Additional masks, such as a hardmask, may also be used. The first etching process may be an anisotropic or isotropic etch process.

Contacts 303 may then be formed so as to contact the substrate 201 and the gate electrode 217. The contacts 303 may comprise a barrier/adhesion layer (not individually shown in FIG. 3) to prevent diffusion and provide better adhesion for the contacts 303. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 303 may be formed of any suitable conductive material, such as a highly-conductive, low-resistive metal, elemental metal, transition metal, or the like. In an exemplary embodiment the contacts 303 are formed of tungsten, although other materials, such as copper, could alternatively be utilized. In an embodiment in which the contacts 303 are formed of tungsten, the contacts 303 may be deposited by CVD techniques known in the art, although any method of formation could alternatively be used.

After the contacts 303 are formed, further processing of the front side 202 of the substrate 201 may be performed. This processing may comprise forming various conductive and dielectric layers (collectively referred to in FIG. 3 by the reference number 305) in order to form interconnections between the individually formed devices to each other. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the first ILD layer 301, a passivation layer 307 may be formed in order to protect the underlying layers from physical and chemical damage. The passivation layer 307 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 307 may be formed through a process such as chemical vapor deposition (CVD), although any suitable process may be utilized.

After processing of the front side 202 of the substrate 201 has been completed, the thickness of the back side 204 of the substrate 201 may reduced, or thinned. Thinning reduces the distance that light travels through the back side 204 of the substrate 201 before it reaches the photosensitive diode 207. The thinning of the back side 204 of the substrate 201 may be performed using a removal process such as chemical mechanical polishing (CMP). In a CMP process, a combination of etching materials and abrading materials are put into contact with the back side 204 of the substrate 201 and a grinding pad (not shown) is used to grind away the back side 204 of the substrate 201 until a desired thickness is achieved. However, any suitable process for thinning the back side 204 of the substrate 201, such as etching or a combination of CMP and etching, may alternatively be used. The back side 204 of the substrate 201 may be thinned so that the substrate 201 has a thickness of between about 1 µm and about 6 µm.

Figure 4:
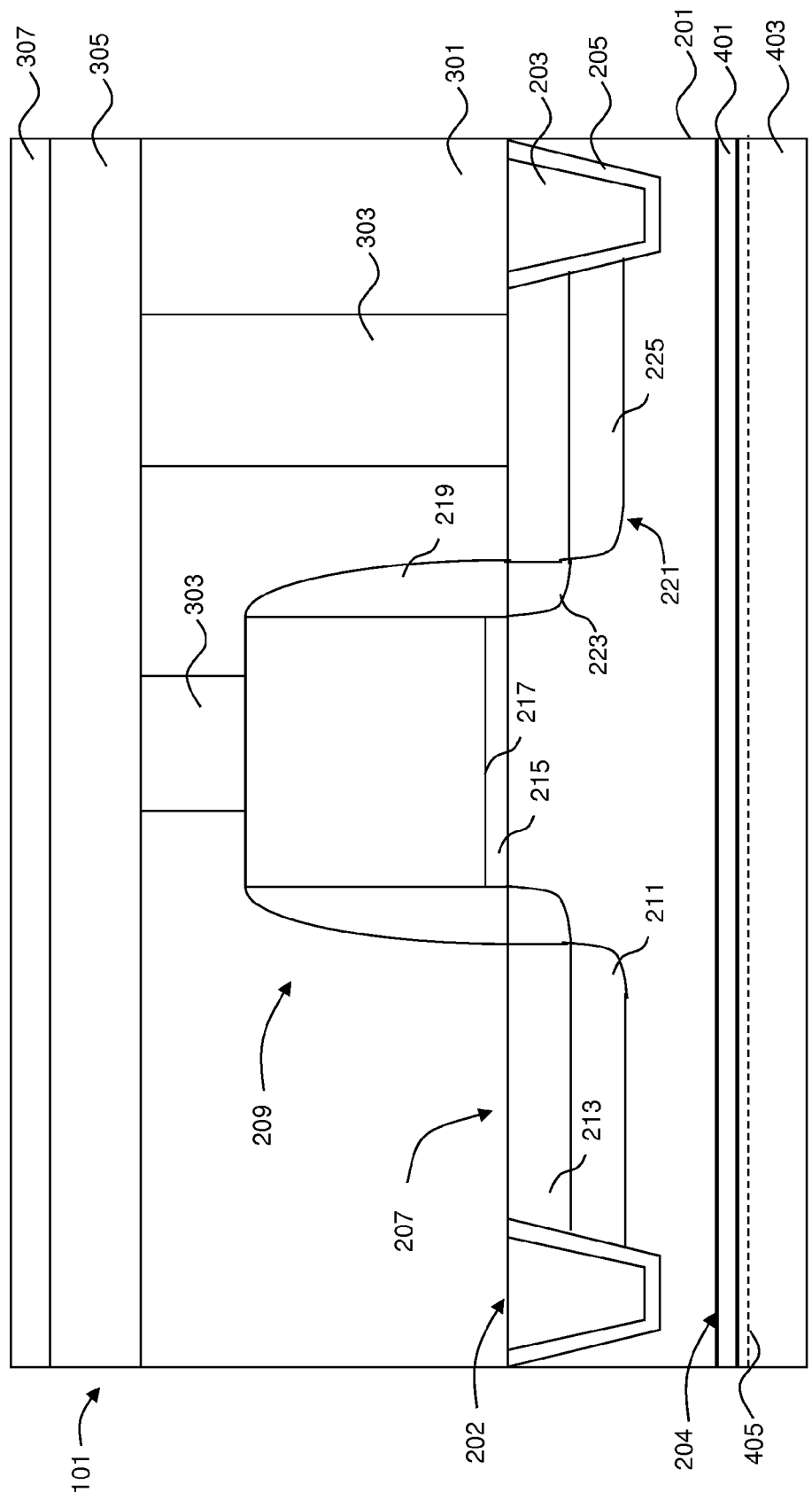
FIG. 4 illustrates a formation of a first metal layer on a back side of the pixel region in accordance with an embodiment.

FIG. 4 illustrates a formation of a buffer layer 401 and a first metal layer 403 on the back side 204 of the substrate 201. The buffer layer 401 may be formed of a transparent material such as silicon oxide and may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In an embodiment, the buffer layer 401 may have a thickness of between about 500 Å and about 3000 Å, such as about 1300 Å.

The first metal layer 403 may be a material that, once patterned (as discussed below with respect to FIGS. 5A-5B) will aid in the prevention of cross-talk between the individual pixel regions 101 (see FIG. 1). In an embodiment, the first metal layer 403 may be formed from a material such as tungsten, although other suitable materials, such as metals like Al, Ta, Cu, etc., or metal-like composites such as TaN, TiN, AlN etc, or other metal or non-metal composites that can absorb visible light (e.g., 400~700 nm wavelength), may alternatively be utilized. Additionally, the first metal layer 403 may be formed such that the first metal layer 403 has a majority amount that has a crystalline orientation of (110) of body-centered cubic structure (space group Im-3 m), which aids the first metal layer 403 during a subsequent patterning (described below with respect to FIGS. 5A-5B). In an embodiment, the first metal layer 403 may be formed to have the (110)-rich crystal orientation using a process such as chemical vapor deposition (CVD) or PVD and controlling the various phases of growth during the deposition process in order to control the crystalline orientation of the first metal layer 403 as it is being deposited or grown.

For example, in an embodiment utilizing CVD, the CVD process may initially utilize a soaking phase to introduce precursor materials to the buffer layer 401 (or to the substrate 201 if the buffer layer 401 is not utilized). The precise precursors to be utilized are in part dependent upon the desired material for the first metal layer 403. However, in an embodiment in which the first metal layer 403 is tungsten, the precursor materials may include a tungsten containing first precursor such as $WF_6$ and a second precursor such as $SiH_4$. The first precursor material may be introduced at a flow rate of between about 20 sccm and about 100 sccm, such as about 60 sccm, while the second precursor material may be introduced at a flow rate of between about 10 sccm and about 50 sccm, such as about 30 sccm.

After the soaking phase of the CVD process, a nucleation phase occurs and deposits a nucleation layer 405 onto the buffer layer 401. The nucleation layer 405 may be the first material of the first metal layer 403 to be deposited, and the remainder of the first metal layer 403 will nucleate from the first metal layer 403. As such, if the nucleation layer 405 is formed to have the desired (110)-rich crystalline orientation, then the remainder of the first metal layer 403 may also be formed in the desired crystalline orientation.

In an embodiment the nucleation layer 405 may be formed to have the desired (110)-rich crystalline orientation by precisely controlling the process conditions during which the nucleation phase is performed. In an embodiment in which the flow rates of the precursor materials are kept constant from the soaking phase (described above), the CVD process may be controlled to deposit the nucleation layer 405 at an ambient temperature of between about 300° C. and about 500° C., such as about 400° C., and a pressure of between about 1 torr and about 90 torr, such as about 5 torr. Additionally, the substrate 201 and the buffer layer 401 may be kept at a temperature of between about 450° C. and about 250° C., such as about 350° C.

The nucleation phase may be continued until the nucleation layer 405 has a suitable thickness to perpetuate the (110)-rich crystalline orientation to the remainder of the first metal layer 403 as the first metal layer 403 is being grown. In an embodiment the nucleation phase may be continued until the nucleation layer 403 has a thickness of between about 10 Å and about 500 Å, such as about 380 Å. Additionally, between about 70% and 100% of the nucleation layer 405 may have the desired (110) crystalline orientation in order to form a (110)-rich crystalline orientation.

After the nucleation phase has deposited the nucleation layer 405 over the buffer layer 401, a bulk growth phase may be utilized to deposit the remainder of the first metal layer 403. During the bulk growth phase the first metal layer 403 may nucleate and grow from the nucleation layer 405 and, as such, the remainder of the first metal layer 403 may be grown with the same crystalline orientation as the nucleation layer 405, such as the (110)-rich crystalline orientation. In an embodiment the bulk growth phase may be performed utilizing the same process conditions as those utilized for the nucleation phase, and may be continued until the first metal layer 403 has an overall thickness of between about 1000 Å and about 3000 Å, such as about 2000 Å.

However, while the above descriptions of the soaking phase, the nucleation phase, and the bulk growth phase describe these phases as all being performed using the same process conditions, these embodiments are not intended to be limited to this description. In alternative embodiments, while the nucleation phase is performed at the desired process conditions to form the nucleation layer 405 to have a (110)-rich crystalline orientation, the soaking phase and the bulk growth phase may be performed at process conditions different from the nucleation phase, as long as the conditions allow for the bulk growth phase to grow the remainder of the first metal layer 403 to have a similar crystalline orientation as the nucleation layer 405. For example, in an embodiment the bulk growth phase may utilize a first precursor flow rate of between about 20 sccm and about 100 sccm, such as about 60 sccm, a second precursor flow rate of between about 10 sccm and about 50 sccm, such as about 30 sccm, an ambient temperature of between about 300° C. and about 500° C., such as about 400° C., a substrate temperature of between about 300° C. and about 500° C., such as about 400° C., and an ambient pressure of between about 1 torr and about 90 torr, such as about 5 torr. These process conditions and any other process conditions that promote a (110)-rich crystal orientation in the first metal layer 403 as it grows on the nucleation layer 405 are fully intended to be included within the scope of the embodiments.

Figure 5A:
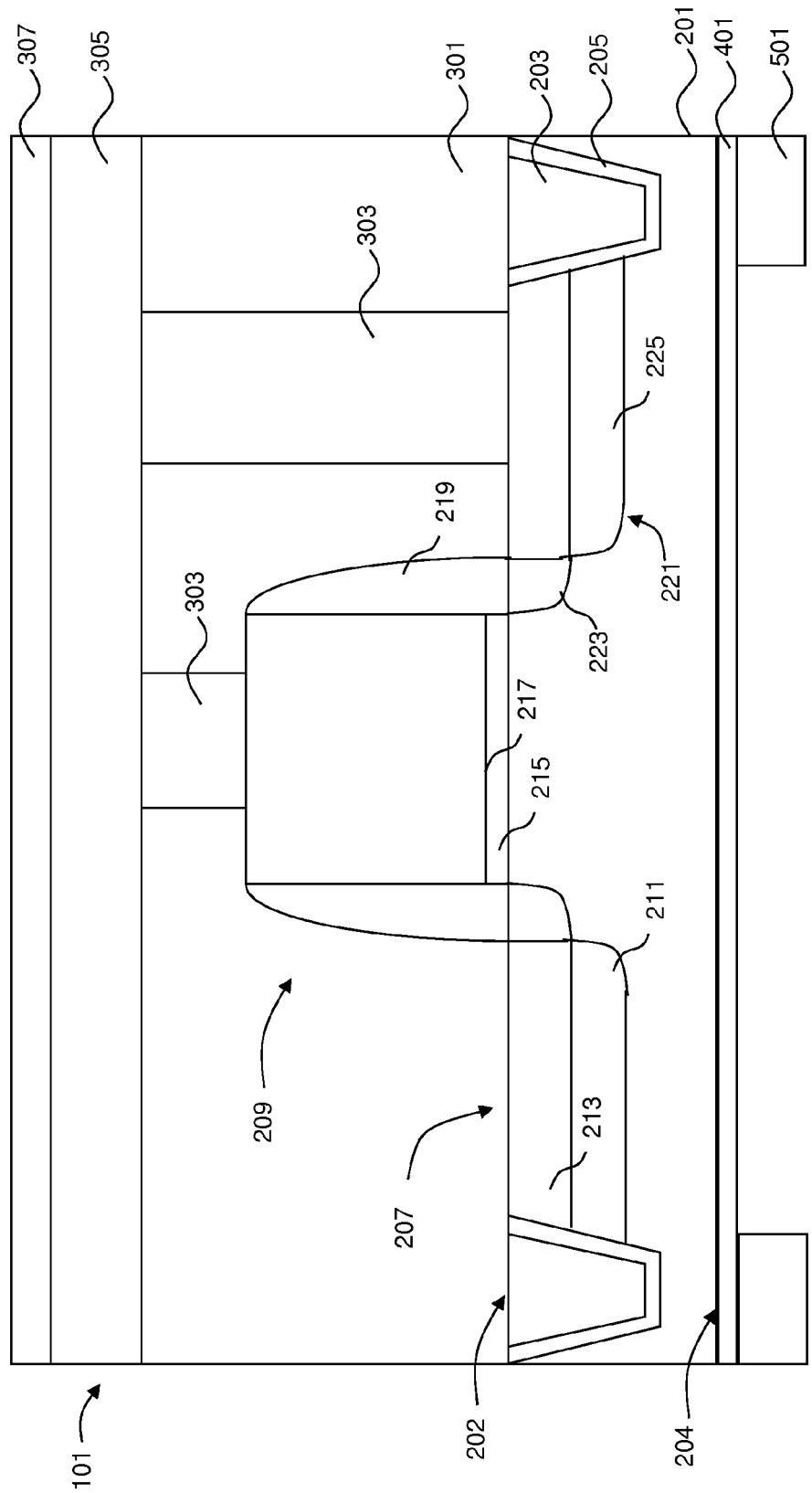
FIGS. 5A-5B illustrate a patterning of the first metal layer into a grid in accordance with an embodiment.
Figure 5B:
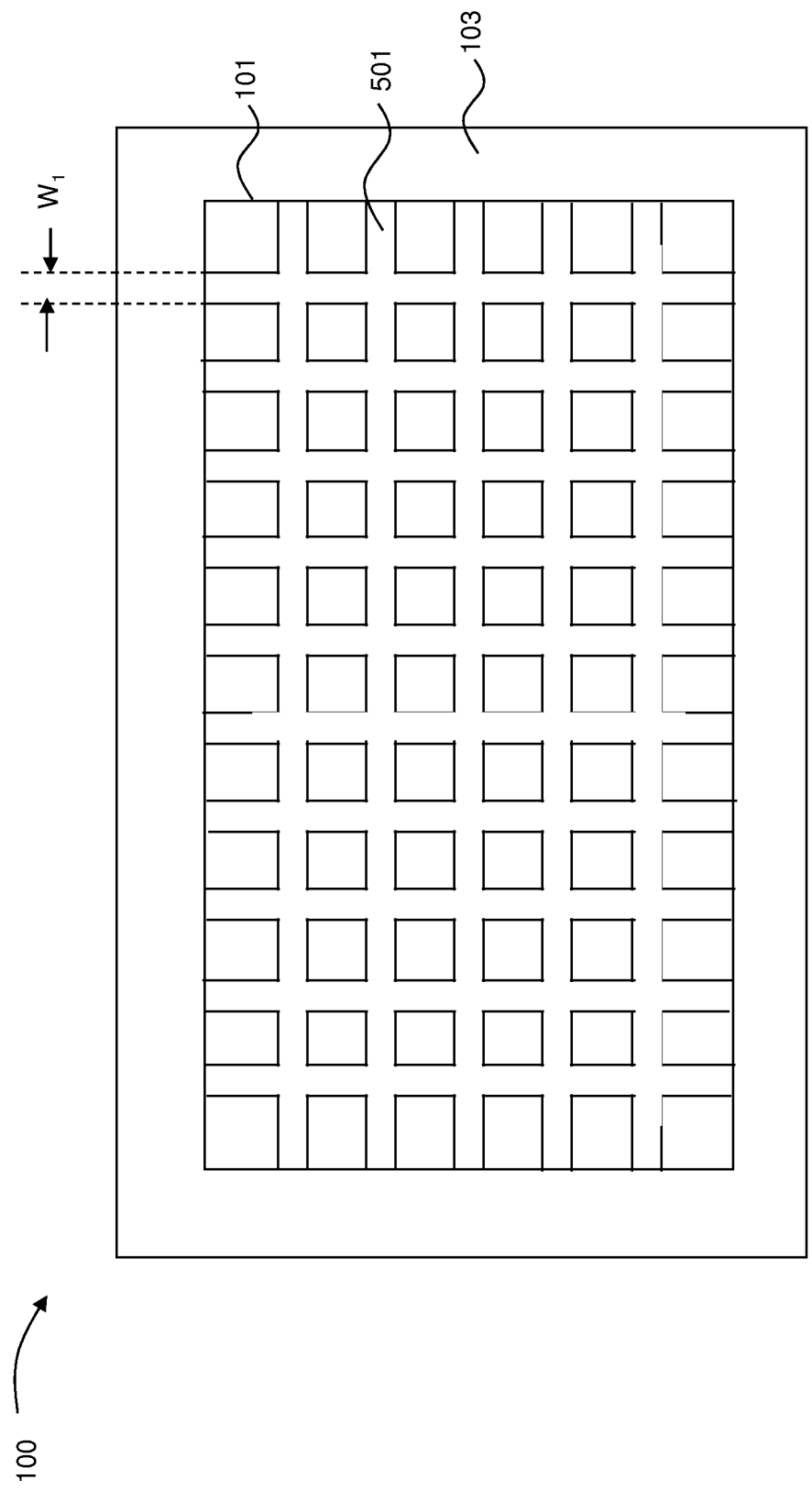

FIGS. 5A-5B illustrate a patterning of the first metal layer 403 to form a grid 501 or lattice after the first metal layer 403 has been blanket deposited, with FIG. 5A illustrating a cross-section of a single pixel region 101 and FIG. 5B illustrating a top down view of the array of pixel regions 101. The first metal layer 403 may be patterned using a photolithographic masking and etching process, in which an energy sensitive photoresist is placed on the first metal layer 403, illuminated by an energy source and developed to expose those portions of the first metal layer 403 which are desired to be removed.

Once the photoresist has been placed, illuminated, and developed, an etching process may be performed to remove those portions of the first metal layer 403 that are not protected by the photoresist. In an embodiment the etching process may be an anisotropic etch such as a reactive ion etch (RIE) using an etchant such as $SF_4$ or $CF_4$. The etching may be performed at a temperature of between about 20° C. and about 150° C., such as about 60° C., and an etchant flow rate of between about 5 sccm and about 100 sccm, such as about 30 sccm. Additionally, the etching may be performed at a power of between about 50 W and about 1500 W, such as about 550 W, and a pressure of between about 1 mtorr and about 50 mtorr, such as about 4 mtorr.

The etching process may be continued until the buffer layer 401 has been exposed and a grid 501 has been formed on the second side 204. As illustrated in FIG. 5B, the grid 501 may run parallel to the edges of the individual pixel regions 101 on the second side 204 of the substrate 201. By placing the grid 501 between the individual pixel regions 101, the grid 501 helps to prevent light intended for one pixel region 101 from crossing into another pixel region 101, thereby helping reduce or eliminate cross-talk between adjacent pixel regions 101. In an embodiment the lines of the grid 501 may have a first width $W_1$ of between about 0.1 μm and about 10 μm, such as about 1.4 μm.

Additionally, because of the (110)-rich crystalline orientation of the first metal layer 403, the etching process used to pattern the first metal layer 403 may provide a much better transfer of the pattern from the photoresist to the first metal layer 403. For example, when a pattern is transferred from a photoresist to an underlying metal layer wherein the underlying metal layer has a larger percentage of material with a (200) crystalline orientation that a (110) crystalline orientation, the resulting grid may have greatly varying thicknesses at different points of the grid. Additionally, defects may occur in such a defective transfer of the pattern, wherein portions of the grid may undesirably be broken off or otherwise missing, causing the metal layer to have large defects.

However, when the first metal layer 403 is formed to have the desired (110)-rich crystal orientation, the etching process may create a grid 501 with much less variation in thickness. Additionally, with the more reliable transfer of the pattern, the defects that may occur in, e.g., a (200)-rich crystalline orientation grid may be reduced or eliminated. By utilizing a grid 501 with less variation in thickness and a reduced number of defects, the grid 501 is more efficient at preventing cross-talk from neighboring pixel regions 101. Additionally, by having a better transfer of the pattern from the photoresist to the underlying first metal layer 403, the process window for the process may be enlarged, as less space is necessary to account for the variations in thickness.

Figure 6:
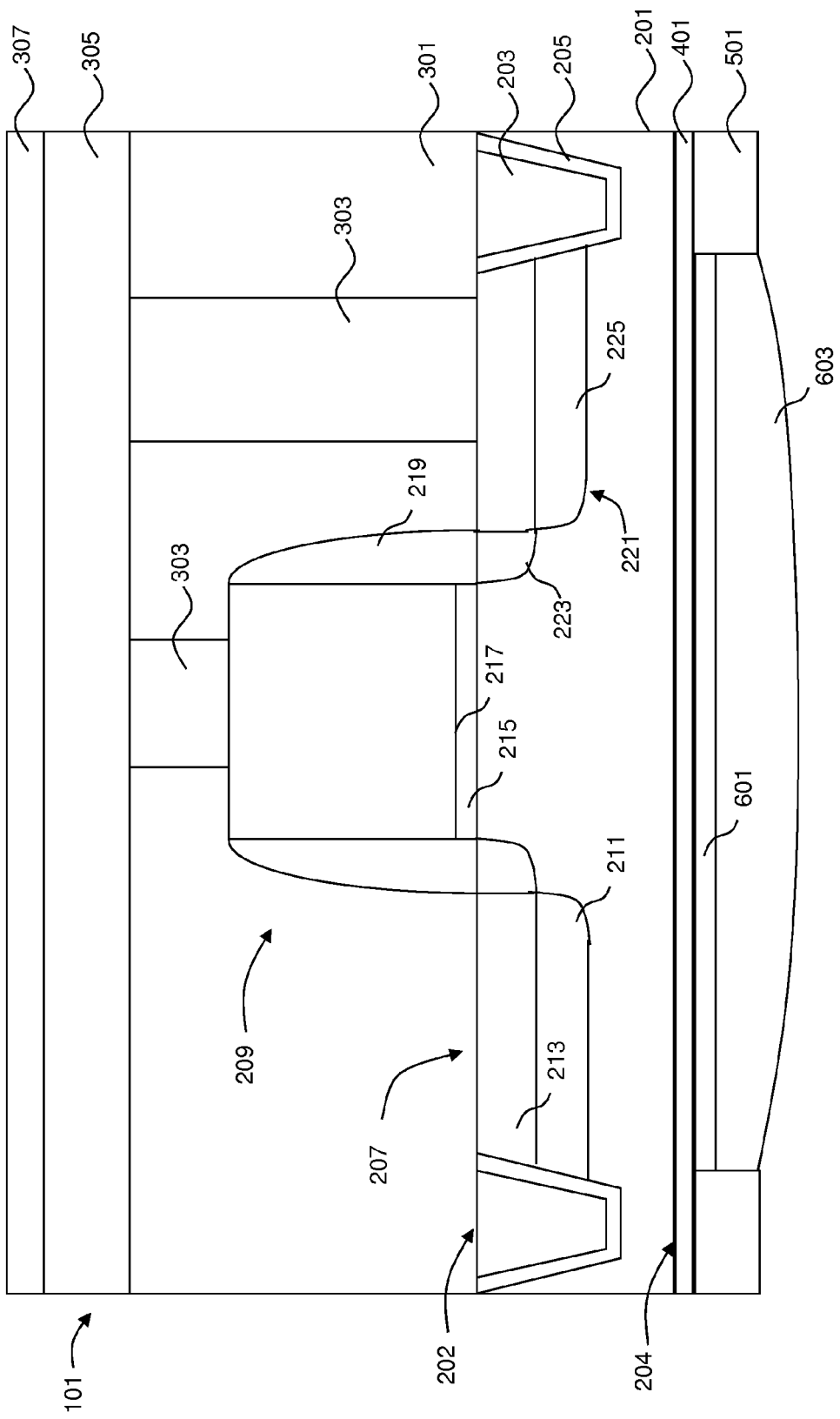
FIG. 6 illustrates a formation of a filter and lens on a back side of the substrate in accordance with an embodiment.

FIG. 6 illustrates the formation of a first color filter 601 and a microlens 603 on the back side 204 of the substrate 201. The first color filter 601 may comprise a filter for one of the primary colors (e.g., red, green, blue) and may be positioned to filter the light that will impinge upon the photosensitive diode 207. The first color filter 601 may comprise a polymeric material or resin, such as a polymeric polymer, which includes colored pigments.

The microlens 603 may be formed opposite the first color filter 601 from the substrate 201, and may be used to focus impinging light more directly onto the photosensitive diode 207. The microlens 603 may be formed by first applying and patterning a positive type photoresist (not shown) over the first color filter 601. Once formed, the patterned photoresist may then be baked to round the photoresist into the curved microlens 603.

In an embodiment a method of manufacturing a semiconductor device comprising forming a photodiode in a pixel region of a semiconductor substrate, the photodiode being formed adjacent to a first surface of a semiconductor substrate, is provided. A blanket grid layer with a (110)-rich crystalline orientation is deposited over a second surface of the semiconductor substrate different than the first surface, and the blanket grid layer with the (110)-rich crystalline orientation is patterned to form a grid on the second surface of the semiconductor substrate.

In accordance with another embodiment a method of manufacturing a semiconductor device comprising defining a pixel region on a semiconductor substrate, the semiconductor substrate having a first side and a second side, and forming a photodiode within the pixel region adjacent to the first side of the semiconductor substrate, is provided. A metal layer is deposited on the second side of the semiconductor substrate, the metal layer having a majority (110) crystalline orientation, and a portion of the metal layer is removed to form a metallic lattice on the second side of the semiconductor substrate.

In accordance with yet another embodiment a semiconductor device comprising a pixel region on a substrate, the pixel region comprising a photodiode formed adjacent to a first side of the substrate, is provided. A grid is located on a second side of the substrate opposite the first side, the grid comprising a first material with a (110)-rich crystalline orientation.

Although the present embodiments and their advantages have been described in detail, it should be understood that various changes, substitutions and alterations can be made herein without departing from the spirit and scope of the embodiments as defined by the appended claims. For example, charge coupled devices (CCD) may be utilized in place of the CMOS devices within the image sensor, different materials may be utilized for the silicide contacts, or different methods of formation may be utilized for the various layers of material. These devices, steps and materials may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method of manufacturing a semiconductor device, comprising:
    forming a photodiode in a pixel region of a semiconductor substrate, the photodiode being formed adjacent to a first surface of a semiconductor substrate;
    depositing a blanket grid layer with a (110)-rich crystalline orientation over a second surface of the semiconductor substrate different than the first surface, wherein the depositing the blanket grid layer further comprises depositing a nucleation layer with a (110)-rich crystalline orientation; and
    patterning the blanket grid layer with the (110)-rich crystalline orientation to form a grid on the second surface of the semiconductor substrate.

2. The method of claim 1, wherein the depositing the blanket grid layer with a (110)-rich crystalline orientation further comprises depositing a blanket layer of tungsten with a (110)-rich crystalline orientation.

3. The method of claim 1, further comprising forming a buffer layer over the second surface of the semiconductor substrate prior to the depositing the blanket grid layer with a (110)-rich crystalline orientation.

4. The method of claim 1, wherein the depositing the blanket grid layer with a (110)-rich crystalline orientation further comprises depositing the blanket grid layer at an ambient temperature between about 300° C. and about 500° C.

5. The method of claim 4, wherein the depositing the blanket grid layer with a (110)-rich crystalline orientation further comprises depositing the blanket grid layer at a pressure of between about 1 torr and about 90 torr.

6. The method of claim 1, wherein the depositing the blanket grid layer with a (110)-rich crystalline orientation further comprises introducing $WF_6$ and $SiH_4$ as precursor materials.

7. The method of claim 1, wherein the patterning the blanket grid layer with the (110)-rich crystalline orientation comprises etching the blanket grid layer with $SF_6$ and $CF_4$ plasma.

8. A method of manufacturing a semiconductor device, the method comprising:
    defining a pixel region on a semiconductor substrate, the semiconductor substrate having a first side and a second side;
    forming a photodiode within the pixel region adjacent to the first side of the semiconductor substrate;
    depositing a metal layer on the second side of the semiconductor substrate, the metal layer having a majority (110) crystalline orientation throughout the metal layer; and
    removing a portion of the metal layer to form a metallic lattice on the second side of the semiconductor substrate.

9. The method of claim 8, wherein the metallic lattice comprises tungsten.

10. The method of claim 8, wherein the metal lattice has a width of between about 2.1 Å and about 2.3 Å.

11. The method of claim 8, further comprising forming a buffer layer on the second side of the substrate prior to the depositing the metal layer.

12. The method of claim 11, wherein the buffer layer comprises silicon oxide.

13. The method of claim 8, wherein the depositing the metal layer is performed at least in part at a pressure between about 1 torr and about 90 torr.

14. The method of claim 13, wherein the depositing the metal layer is performed at least in part at an ambient temperature between about 300° C. and about 500° C.

15. The method of claim 8, wherein the depositing the metal layer is performed at least in part by introducing $WF_6$ and $SiH_4$ as precursors.

16. A semiconductor device comprising:
    a pixel region on a substrate, the pixel region comprising a photodiode formed adjacent to a first side of the substrate; and
    a grid located on a second side of the substrate opposite the first side, the grid comprising a first material with a (110)-rich crystalline orientation, wherein the first material extends throughout the grid.

17. The semiconductor device of claim 16, wherein the first material is a metal.

18. The semiconductor device of claim 17, wherein the metal is tungsten.

19. The semiconductor device of claim 16, further comprising a transistor adjacent to the photodiode on the first side of the substrate.

20. The semiconductor device of claim 16, wherein the grid has a width of 1.4 μm.

* * * * *